United States Patent
Li et al.

(10) Patent No.: US 10,510,708 B2
(45) Date of Patent: Dec. 17, 2019

(54) ANISOTROPIC CONDUCTIVE FILM (ACF) AND FORMING METHOD THEREOF, ACF ROLL, BONDING STRUCTURE AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Wei Li, Beijing (CN); Wei He, Beijing (CN); Jing Wang, Beijing (CN); Chao Fu, Beijing (CN); Chaofan Li, Beijing (CN); Zhiyong Yang, Beijing (CN); Liwei Huang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 15/994,529

(22) Filed: May 31, 2018

(65) Prior Publication Data
US 2019/0035760 A1    Jan. 31, 2019

(30) Foreign Application Priority Data

Jul. 27, 2017 (CN) .......................... 2017 1 0626425

(51) Int. Cl.
*H01L 23/00* (2006.01)

(52) U.S. Cl.
CPC .............. *H01L 24/29* (2013.01); *H01L 24/27* (2013.01); *H01L 24/04* (2013.01); *H01L 24/32* (2013.01);
(Continued)

(58) Field of Classification Search
CPC ....... H01L 24/27; H01L 24/04; H01L 24/083; H01L 2224/04026; H01L 2224/05644;
(Continued)

(56) References Cited

U.S. PATENT DOCUMENTS

2001/0008169 A1    7/2001  Connell et al.
2005/0110406 A1*   5/2005  Jeong .................... H01R 12/62
                                                                    313/582
(Continued)

FOREIGN PATENT DOCUMENTS

CN           1307625 A      8/2001
CN         105006461 A     10/2015
(Continued)

OTHER PUBLICATIONS

The First Chinese Office Action dated Sep. 5, 2018; Appln. No. 201710626425.7.

*Primary Examiner* — Zandra V Smith
*Assistant Examiner* — Andre C Stevenson

(57) ABSTRACT

Embodiments of the present disclosure provide an anisotropic conductive film and a forming method thereof, an ACF roll, a bonding structure and a display device. The anisotropic conductive film (ACF) includes: an insulating adhesive layer, including a plurality of preset regions corresponding to electrodes to be bonded and spaced from each other; and capsule structures, dispersed in the insulating adhesive layer of the plurality of preset regions and configured to realize a electrical connection in a direction perpendicular to a surface of the ACF when the ACF is subjected to a pressure in the direction perpendicular to the surface of the ACF, wherein a number of the capsule structures in each of the plurality of preset regions is greater than a preset number.

17 Claims, 3 Drawing Sheets

(52) U.S. Cl.
CPC .... *H01L 24/83* (2013.01); *H01L 2224/04026* (2013.01); *H01L 2224/05644* (2013.01); *H01L 2224/279* (2013.01); *H01L 2224/2939* (2013.01); *H01L 2224/29444* (2013.01); *H01L 2224/29455* (2013.01); *H01L 2224/29499* (2013.01); *H01L 2224/32227* (2013.01); *H01L 2224/83132* (2013.01); *H01L 2224/83203* (2013.01)

(58) Field of Classification Search
CPC ........... H01L 224/279; H01L 2224/279; H01L 2227/2939; H01L 2224/29444
See application file for complete search history.

(56) References Cited

U.S. PATENT DOCUMENTS

| | | | |
|---|---|---|---|
| 2007/0122960 A1* | 5/2007 | Aoki | H01L 23/49822 438/197 |
| 2015/0138626 A1* | 5/2015 | Kwon | G02F 1/167 359/296 |
| 2017/0278820 A1 | 9/2017 | Shinohara | |

FOREIGN PATENT DOCUMENTS

| | | |
|---|---|---|
| CN | 105969237 A | 9/2016 |
| CN | 106797081 A | 5/2017 |
| WO | 2016/104463 A1 | 6/2016 |

\* cited by examiner

– 1 –

ANISOTROPIC CONDUCTIVE FILM (ACF) AND FORMING METHOD THEREOF, ACF ROLL, BONDING STRUCTURE AND DISPLAY DEVICE

TECHNICAL FIELD

The present disclosure relates to an anisotropic conductive film and a forming method thereof, an ACF roll, a bonding structure and a display device.

BACKGROUND

Anisotropic conductive film (ACF for short) is generally composed of an insulating adhesive body and microcapsules dispersed in the insulating adhesive body. The microcapsule has a Core@Shell structure and is composed of a conductive ball as the core and an insulating layer as the shell and covered a surface of the conductive ball. When the microcapsule is subjected to extrusion in a direction perpendicular to an ACF surface, the insulating layer on the surface is cracked to expose the conductive ball inside, thus realizing the directional conductive connection in the direction perpendicular to the ACE surface.

SUMMARY

At least one embodiment of the present disclosure provides an anisotropic conductive film and a forming method thereof, an ACF roll, a bonding structure and a display device, when the anisotropic conductive film is applied to a bonding structure, the number uniformity of the conductive particles captured by the electrodes can be improved, the risk of poor bonding process of the display module can be reduced, and the product yield can be improved.

At a first aspect, an embodiment of the present disclosure provides an anisotropic conductive film (ACF), which comprises: an insulating adhesive layer, including a plurality of preset regions corresponding to electrodes to be bonded and spaced from each other; and capsule structures, dispersed in the insulating adhesive layer of the plurality of preset regions and configured to realize a electrical connection in a direction perpendicular to a surface of the ACF when the ACF is subjected to a pressure in the direction perpendicular to the surface of the ACF, wherein a number of the capsule structures in each of the plurality of preset regions is greater than a preset number.

At a second aspect, an embodiment of the present disclosure provides ACF roll, which comprises: a plurality of ACFs according to the first aspect and successively connected.

At a third aspect, an embodiment of the present disclosure provides a bonding structure, which comprises: a first substrate and a second substrate which are oppositely arranged; and the ACF according to the first aspect, disposed between the first substrate and the second substrate and configured to realize an electrical connection between a first electrode on the first substrate and a second electrode, wherein in a direction perpendicular to the first substrate and the second substrate, the preset regions are disposed between the first electrode and the second electrode.

At a third aspect, an embodiment of the present disclosure provides a display device, which comprises the bonding structure according to the third aspect.

At a fourth aspect, an embodiment of the present disclosure provides a method for forming an ACF, used for forming the ACF according to the first aspect, which comprises: providing a substrate; forming a first insulating layer on the substrate; forming a plurality of spaced preset spacing grooves, corresponding to electrodes to be bonded, on the first insulating layer by patterning the first insulating layer; providing capsule structures, of which a number is greater than a preset number, in each of the plurality of spaced preset spacing grooves; and forming a second insulating layer to cover the capsule structures.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not I imitative of the invention.

Figure 1:
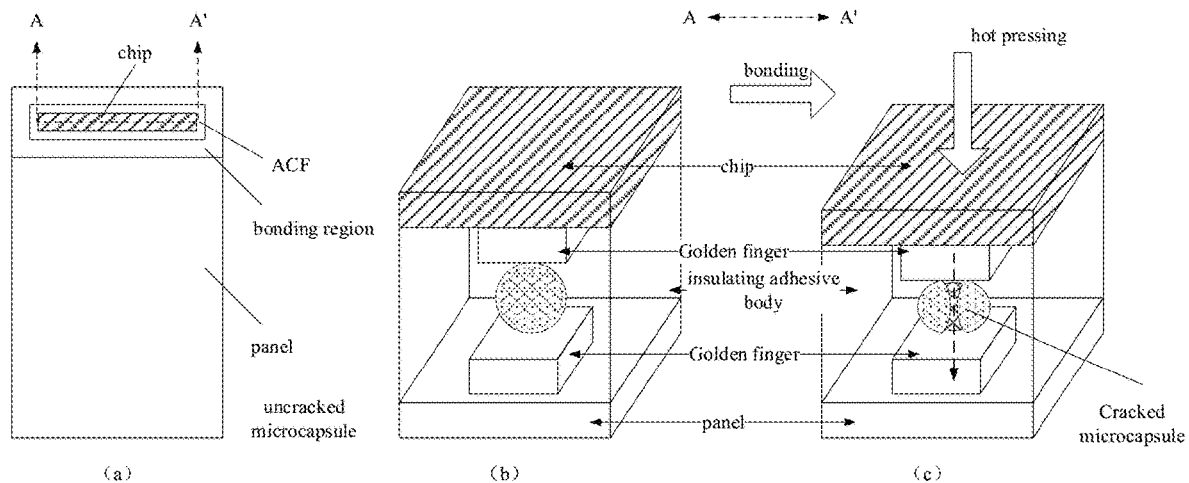
FIG. 1 is a schematic diagram illustrating a bonding of an IC and a Panel via an ACF, in which (a) is a schematic structural top view, and (b) and (c) are schematic structural sectional views along a A-A' direction in (a)

Reference numerals of the accompanying drawings:

1—ACF; 10—insulating adhesive layer; 10*a*—preset region; 11—capsule structure; 12—first bonding alignment mark; 2—first electrode; 3—second bonding alignment mark.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

ACF is widely applied in a manufacturing filed of electronic devices. Taking a chip on glass (COG, referring to the case that a chip is directly bonded to a display panel) display module as an example, the specific bonding connection principle of the ACF is as follows. As shown by an (a) part in FIG. 1, golden fingers are formed on both a bonding region of a panel and a corresponding region of an integrated circuit (IC). The golden finger is composed of a plurality of golden conductive contact sheets. As Au or Cu materials with high electric conductivity are coated on a surface of the golden finger, and the conductive contact sheets are arranged in the form of a finger, it is usually called "gold finger" in the industry. As shown by (b) and (c) parts in FIG. 1, the ACF is attached to the upper and lower two golden fingers and subjected to hot pressing under the conditions of certain temperature, pressure and time, so that a microcapsule between the upper and lower two golden fingers is extruded to expose a conductive ball inside, thus realizing the conductive connection between the upper and lower golden fingers (as shown by a dotted arrow in the figure).

As the IC and the panel need to realize signal conduction via the ACF, the capture of the conductive ball by the golden fingers is important to the normal display of the module.

Figure 2:
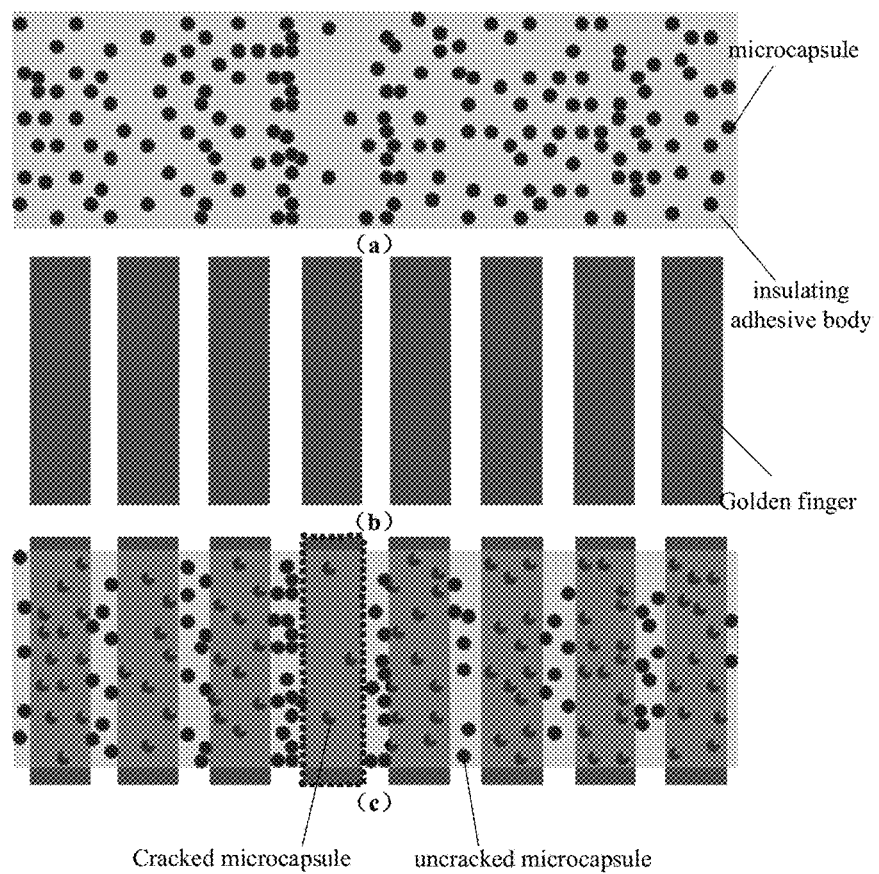
FIG. 2 is a schematic structural view illustrating poor capture of conductive balls by a golden finger, in which (a) is a schematic structural top view of the ACF; (b) is a schematic structural top view of the golden fingers; (c) is a schematic structural top view of a product obtained after the bonding of the ACF and the golden fingers.

As shown in FIG. 2, in one technical solution, as the microcapsules are randomly arranged in the insulating adhesive body, the number of the microcapsules distributed in different regions is significantly different, namely the number is large in some regions and small in some other regions, thus increasing the probability of a small number of conductive balls contacted (namely captured) by a part of the conductive contact sheets during bonding, as shown by a dotted line frame in the (c) part of the figure, increasing the resistance between the opposite golden fingers on the IC and the Panel, resulting in poor signal conduction, increasing the risk of poor wiring contact, abnormal module display or the case that the module cannot be displayed, and affecting the product yield.

Embodiment 1

Figure 3:
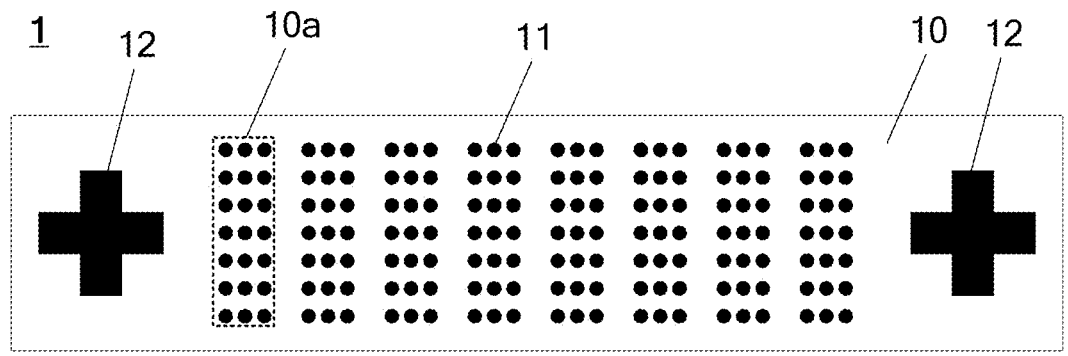
FIG. 3 is a schematic structural view of an ACF provided by an embodiment 1 of the present disclosure.

As illustrated in FIG. 3, an embodiment of the present disclosure provides an ACF 1, which comprises: an insulating adhesive layer 10 including a plurality of preset regions 10a spaced from each other and corresponding to electrodes to be bonded (as shown by a dotted line frame in the figure); and capsule structures 11 dispersed in the insulating adhesive layer 10 of the preset regions 10a and configured to realize the conductive connection in a direction perpendicular to an ACF surface when the ACF 1 is subjected to a pressure in the direction perpendicular to the ACF surface, in which the number of the capsule structures 11 in each preset region 10a is greater than a preset number.

It should be noted that: firstly, a specific structure of the insulating adhesive layer 10 and the capsule structures 11 may adopt a structure known by the inventor, and no limitation will be given here in an embodiment of the present disclosure.

Illustratively, a material of the insulating adhesive layer 10 may include resin, namely include a resin base material.

The capsule structure 11 may include a conductive particle and an insulator covered a surface of the conductive particle. The insulator may be cracked to expose the conductive particle inside when the ACF 1 is subjected to a pressure in a direction perpendicular to the ACF surface, thus realizing the conductive connection in the direction perpendicular to the ACF surface. The conductive particle may more specifically include an elastic intermediate (generally organic material, polymer) and a metal layer (e.g., Au and/or Ni materials) covering the surface of the elastic intermediate.

A shape of the capsule structure 11 includes but not limited to a spherical shape shown in FIG. 3, and may also be a cylinder or a cube. When the spherical capsule structure 11 is subjected to the pressure in the direction perpendicular to the ACF surface, the insulator on the surface is easily cracked to expose the conductive ball inside.

Moreover, a specific size of the capsule structure 11 may be flexibly adjusted according to design parameters of a product to which the ACF 1 is applied. No limitation will be given here in the embodiment of the present disclosure.

Secondly, FIG. 3 only illustrates the possible number of preset regions 10a, the possible number and an arrangement manner of the capsule structures 11 in the ACF 1. The embodiment of the present disclosure is not limited thereto, as long as the number of the capsule structures 11 in each preset region 10a is greater than the preset number, the preset number may be 5ea, the embodiment of the present disclosure does not limit the present number, which may be determined according to actual process conditions and specification requirements of ACF.

Here, the preset number can ensure that when the ACF 1 is bonded to electrodes of the upper and lower golden finger to be bonded, the number of the conductive particles in corresponding preset regions 10a captured by electrodes can avoid defective conduction between the upper and lower electrodes, avoid a problem of poor wiring contact, abnormal module display or the case that the module cannot be displayed, and improve the product yield.

On this basis, by adoption of the ACF 1 provided by the embodiment 1 of the present disclosure, distributed regions of the capsule structures 11 dispersed in the insulating adhesive layer 10 correspond to the electrodes to be bonded; the number of the capsule structures 11 dispersed in each preset region 10a is greater than the preset number; and the number uniformity of the conductive particles captured by the electrodes during bonding can be improved. The application of the ACF 1 to bonding in a display module can reduce the risk of poor bonding process of the display module due to a small number of conductive particles captured by the electrodes, and improve the product yield.

On this basis, in order to further improve the number uniformity of the conductive particles captured by the electrodes in the bonding process, illustratively, as shown in FIG. 3, the capsule structures 11 in each preset region 10a are arranged in an array and uniformly dispersed.

Here, the array arrangement may be multiple rows x multiple columns arrangement as shown in the figure and may also be one column arrangement corresponding to a longitudinal direction of the electrode, as long as regular arrangement can be realized.

The specific forming process of the above array arrangement includes but not limited to the following means: firstly, forming an insulating adhesive layer; secondly, forming a plurality of spacing grooves arranged in an array on the insulating adhesive layer by a patterning process; thirdly, placing capsule structures in each spacing groove in one-to-one correspondence relationship, and forming capsule structures 11 arranged in an array; and finally, forming a second insulating adhesive layer for covering the capsule structures 11.

Moreover, as shown in FIG. 3, the plurality of preset regions 10a spaced from each other may be arranged along the longitudinal direction parallel to the ACF 1; the insulating adhesive layer 10 further includes an alignment region disposed outside the preset regions 10a; and the ACF 1 further includes a first bonding alignment mark 12 disposed in the insulating adhesive layer 10 of the alignment region and/or a surface of the insulating adhesive layer 10.

Here, the alignment region refers to a peripheral region in which no capsule structure 11 is dispersed (non-conductive film (NCF)). As the insulating adhesive layer 10 is in the shape of a transparent tape, the first bonding alignment marks 12 with opaque color may be further disposed in a region in which no capsule structure 11 is dispersed, so as to be aligned with the electrodes in the bonding process. The first bonding alignment mark 12 may be specifically disposed in the insulating adhesive layer 10 and/or a surface of the insulating adhesive layer 10, as long as the first bonding alignment marks 12 can be recognized, captured and aligned by an alignment device in the bonding process.

A specific pattern of the first bonding alignment mark 12 includes but not limited to a crisscross shape as shown in the figure.

Moreover, the first bonding alignment marks 12 may be disposed at two ends in the longitudinal direction of the ACF 1, so as to implement recognition.

Illustratively, in a cross section parallel to the ACF, each of the plurality of preset regions is a strip-shaped region, a trapezoidal region, etc. The shape of the preset region may be determined according to actual conditions.

Illustratively, an extension direction of the strip-shaped region is parallel to a width direction of the ACF, and the plurality of strip-shaped regions are arranged along the length direction parallel to the ACF.

Illustratively, the shape of the preset regions is the same with the shape of the electrodes to be bonded.

Illustratively, in a plane parallel to the ACF, an orthographic projection of the preset region coincides with an orthographic projection of the electrode to be bonded, or the orthographic projection of the preset region falls within the orthographic projection of the electrode to be bonded.

Alternatively, in the plane parallel to the ACF, the orthographic projection of the preset region may be partially coincident with the orthographic projection of the electrode to be bonded.

Embodiment 2

The embodiment of the present disclosure further provides an ACF roll, which comprises a plurality of sequentially connected ACFs 1 as shown in FIG. 3.

Thus, in actual mass production, the ACF roll may be cut to form sheets obtained after single cutting as shown in FIG. 1.

Embodiment 3

The embodiment of the present disclosure further provides a bonding structure, which comprises a first substrate and a second substrate which are oppositely arranged. The ACF provided by the embodiment 1 of the present disclosure is disposed between the first substrate and the second substrate and configured to realize the electrical connection between a first electrode on the first substrate and a second electrode, wherein in a direction perpendicular to the first substrate and the second substrate, the preset region is disposed between the first electrode and the second electrode.

Illustratively, a plurality of spaced first electrodes (namely Bump, a protruded bonding structure) are disposed on a side of the first substrate facing the second substrate, and the second electrodes (namely Bumps), in vertical correspondence with the first electrodes, are disposed on a side of the second substrate facing the first substrate; and the plurality of second electrodes are in one-to-one vertical correspondence with the first electrodes, in which the preset regions fall within regions of the first electrodes in vertical correspondence with the second electrodes.

In this way, when the ACF 1 is subjected to a pressure in a direction perpendicular to the ACF surface, the capsule structures 11, disposed in the preset regions between the first electrodes and the second electrodes which are opposite to each other, are cracked to expose the conductive particles inside, thus realizing the conduction between the first electrodes and the second electrodes at upper and lower ends, and realizing the conductive connection in the direction perpendicular to the ACF surface.

In order to improve the accuracy of bonding alignment, the first electrode and the second electrode have same width; a space between two adjacent first electrodes is the same with a space between two adjacent second electrodes; and as shown in FIG. 3, the plurality of spaced preset regions 10a are sequentially arranged along the length direction parallel to the ACF 1.

Figure 4:
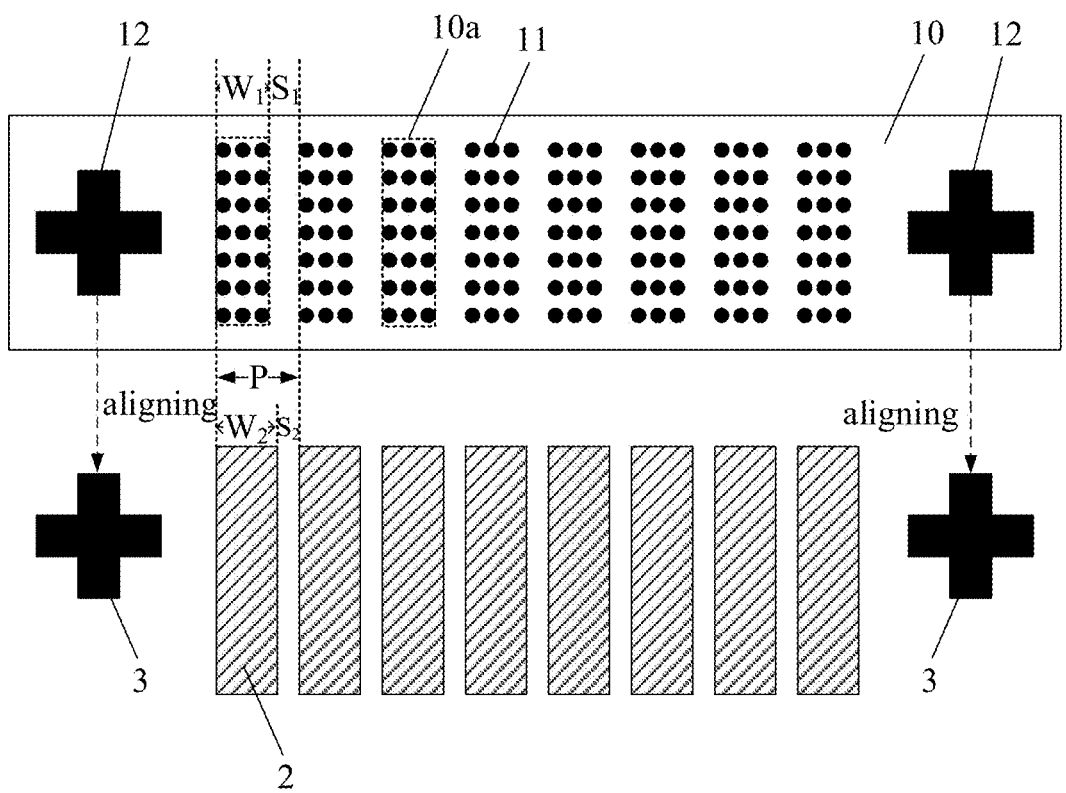
FIG. 4 is a schematic diagram illustrating a bonding alignment of a bonding structure provided by an embodiment 3 of the present disclosure.

The description here only takes the first electrode on a side during bonding as an example. As shown in FIG. 4, along the length direction of the ACF, a sum of a width (marked as $W_1$ in the figure) of the preset region 10a and the space (marked as $S_1$ in the figure) between two adjacent preset regions 10a is a first pitch (marked as P in the figure); and the first pitch P is equal to a sum of a width (marked as $W_2$ in the figure) of the first electrode 2 and the space (marked as $S_2$ in the figure) between two adjacent first electrodes 2. That is to say, the arrangement mode of the conductive particles in the ACF is adapted to the pitch of the bonded electrodes, so as to improve the effective rate of utilization between the electrodes and the conductive particles.

Figure 5:
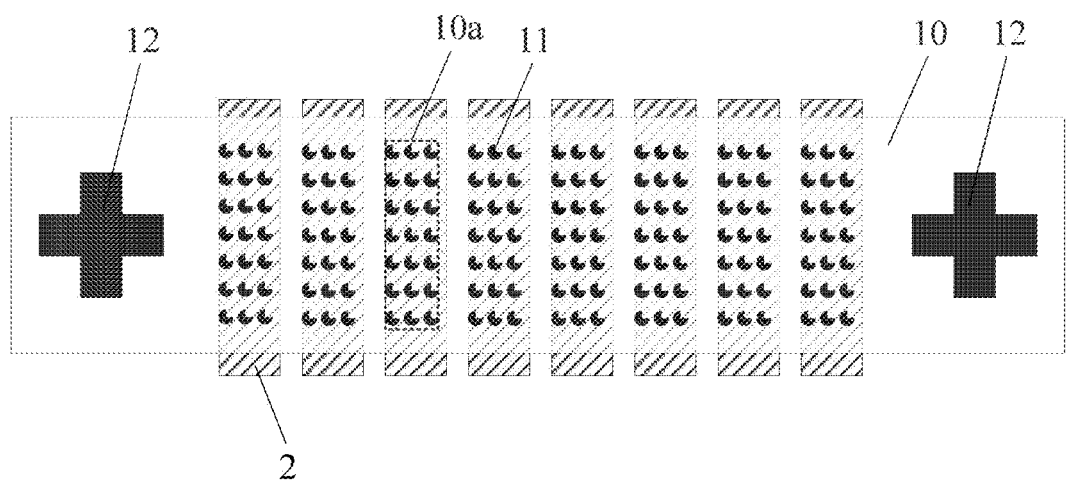
FIG. 5 is a schematic structural view of a product obtained after bonding of the bonding structure provided by the embodiment 3 of the present disclosure.

The structure obtained after bonding of the electrodes and the ACF is as shown in FIG. 5. For the sake of clarity, the second electrode is not shown in the figure. The number uniformity of the conductive particles captured by the bonded electrodes is good, and the probability of a small number of conductive particles captured by a single or a plurality of electrodes is small, so the risk of poor bonding can be reduced.

Moreover, the width of the preset region 10a is less than the width of corresponding first electrode 2, namely the spacing between the first electrodes 2 is slightly larger than the spacing between the preset regions 10a, so as to further improve the capture rate of the conductive particles by the electrodes.

On this basis, as shown in FIG. 4, when the ACF further includes the first bonding alignment mark 12, a second bonding alignment mark 3 corresponding to the first bonding alignment mark 12 is also disposed on a side of the first substrate provided with the first electrode and/or a side of the second substrate provided with the second substrate.

Here, the positions of the second bonding alignment mark 3 and the first bonding alignment mark 12 correspond to each other in the vertical direction, and patterns are preferably same.

Embodiment 4

The embodiment of the present disclosure further provides a display device, which comprises the bonding structure as shown in FIGS. 4 and 5.

The arrangement mode of the capsule structures in the ACF provided by the embodiment of the present disclosure is applicable for the bonding process of small-size module products, for instance, adapted to the case of small pitch value of the golden finger (namely the electrodes).

Wherein, the first substrate may be a display panel. Illustratively, the display panel may be a liquid crystal display (LCD) display panel or an organic light-emitting diode (OLED) display panel.

A drive circuit or a driver chip may be mounted on the second substrate. Illustratively, the second substrate may be a chip on film (COF) substrate or a flexible panel connector (FPC) substrate, and is provided with a driver chip configured to generate a driving signal. In response to various kinds of control signals through the second substrate, the driver chip may generate the driving signal to drive the display panel. The driving signal generated by the driver chip of the second substrate may be applied to gate lines and data lines in the display panel, and then drives the display panel to implement operations.

What are described above is related to the specific embodiments of the disclosure only and not limitative to the scope of the disclosure. The protection scope of the disclosure shall be based on the protection scope of the claims.

The application claims priority to the Chinese patent application No. 201710626425.7, filed Jul. 27, 2017, the disclosure of which is incorporated herein by reference as part of the application.

The invention claimed is:

1. An anisotropic conductive film (ACF), comprising:
an insulating adhesive layer, including a plurality of preset regions corresponding to electrodes to be bonded and spaced from each other; and
capsule structures, dispersed in the insulating adhesive layer of the plurality of preset regions and configured to realize a electrical connection in a direction perpendicular to a surface of the ACF when the ACF is subjected to a pressure in the direction perpendicular to the surface of the ACF,
wherein a number of the capsule structures in each of the plurality of preset regions is greater than a preset number,
wherein the anisotropic conductive film is disposed on a non-display region of a display device, and the capsule structure is not disposed outside the plurality of preset regions.

2. The ACF according to claim 1, wherein the capsule structures in each of the plurality of preset regions are arranged in an array and uniformly dispersed.

3. The ACF according to claim 1, wherein
the plurality of preset regions spaced from each other are arranged along a length direction parallel to the ACF;
the insulating adhesive layer further includes an alignment area disposed outside the preset regions; and
the ACF further comprises a first bonding alignment mark disposed in the insulating adhesive layer of the alignment region of and/or a surface of the insulating adhesive layer.

4. The ACF according to claim 3, wherein the first bonding alignment marks are disposed at two ends in the length direction of the ACF.

5. The ACF according to claim 1, wherein each of the plurality of preset regions is a strip-shaped region.

6. The ACF according to claim 5, wherein an extension direction of the strip-shaped region is parallel to a width direction of the ACF; and the plurality of strip-shaped region are arranged along the length direction of the ACF.

7. The ACF according to claim 1, wherein a shape of the preset regions is a same with a shape of the electrodes to be bonded.

8. The ACF according to claim 1, wherein in a plane parallel to the ACF, an orthographic projection of the preset region coincides with an orthographic projection of the electrode to be bonded, or the orthographic projection of the preset region falls within the orthographic projection of the electrode to be bonded.

9. An ACF roll, comprising:
a plurality of ACFs according to claim 1 and successively connected.

10. A bonding structure, comprising:
a first substrate and a second substrate which are oppositely arranged; and
the ACF according to claim 1, disposed between the first substrate and the second substrate and configured to realize an electrical connection between a first electrode on the first substrate and a second electrode,
wherein in a direction perpendicular to the first substrate and the second substrate, the preset regions are disposed between the first electrode and the second electrode.

11. The bonding structure according to claim 10, wherein a plurality of the first electrodes spaced from each other are disposed on a side of the first substrate facing the second substrate; a plurality of the second electrode spaced from each other are disposed on a side of the second substrate facing the first substrate; and the plurality of second electrodes and the first electrodes are in a one-to-one vertical correspondence relationship.

12. The bonding structure according to claim 11, wherein the first electrode and the second electrode have same width; a spacing between two adjacent first electrodes is a same with a spacing between two adjacent second electrodes;
the plurality of preset regions spaced from each other are sequentially arranged along a length direction parallel to the ACF;
along the length direction of the ACF, a sum of a width of the preset region and a spacing between two adjacent preset regions is a first pitch; and the first pitch is equal to a sum of a width of the first electrode and the spacing between the two adjacent first electrodes.

13. The bonding structure according to claim 12, wherein the width of the preset region is less than the width of corresponding the first electrode.

14. The bonding structure according to claim 10, wherein under a condition that the ACF further includes a first bonding alignment mark, a second bonding alignment mark corresponding to the first bonding alignment mark is disposed on a side of the first substrate provided with the first electrode and/or a side of the second substrate provided with the second electrode.

15. A display device, comprising the bonding structure according to claim 10.

16. A method for forming an ACF, used for forming the ACF according to claim 1, comprising:
providing a substrate;
forming a first insulating layer on the substrate;
forming a plurality of spaced preset spacing grooves, corresponding to electrodes to be bonded, on the first insulating layer by patterning the first insulating layer;

providing capsule structures, of which a number is greater than a preset number, in each of the plurality of spaced preset spacing grooves; and forming a second insulating layer to cover the capsule structures.

17. The method for forming the ACF according to claim 16, wherein materials of the first insulating layer and the second insulating layer are identical.

* * * * *